United States Patent
Zhang et al.

(10) Patent No.: US 11,190,211 B2
(45) Date of Patent: Nov. 30, 2021

(54) METHOD AND DEVICE OF SELECTING BASE GRAPH OF LOW-DENSITY PARITY-CHECK CODE

(71) Applicant: CHINA ACADEMY OF TELECOMMUNICATIONS TECHNOLOGY, Beijing (CN)

(72) Inventors: Di Zhang, Beijing (CN); Jiaqing Wang, Beijing (CN); Xueming Pan, Beijing (CN); Shaohui Sun, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 111 days.

(21) Appl. No.: 16/610,722

(22) PCT Filed: Apr. 19, 2018

(86) PCT No.: PCT/CN2018/083743
§ 371 (c)(1),
(2) Date: Nov. 4, 2019

(87) PCT Pub. No.: WO2018/201912
PCT Pub. Date: Nov. 8, 2018

(65) Prior Publication Data
US 2020/0162109 A1    May 21, 2020

(30) Foreign Application Priority Data

May 5, 2017    (CN) .......................... 201710314028.6
May 23, 2017   (CN) .......................... 201710367204.2

(51) Int. Cl.
*H03M 13/11*    (2006.01)
*H04L 1/00*     (2006.01)
*H03M 13/00*    (2006.01)

(52) U.S. Cl.
CPC .... *H03M 13/1148* (2013.01); *H03M 13/1105* (2013.01); *H03M 13/116* (2013.01);
(Continued)

(58) Field of Classification Search
CPC ......... H03M 13/1148; H03M 13/1105; H03M 13/1151; H03M 13/1154; H03M 13/116;
(Continued)

(56) References Cited

U.S. PATENT DOCUMENTS 10,340,949 B2 *  7/2019  Soriaga ............... H03M 13/635
2005/0246615 A1 * 11/2005  Matsumoto ........ H03M 13/1151
                                                          714/801
(Continued)

FOREIGN PATENT DOCUMENTS

CN    101141133 A    3/2008
CN    101217337 A    7/2008
(Continued)

OTHER PUBLICATIONS

"Notification of Reason for Refusal", Korean Intellectual Property Office, dated Sep. 22, 2020, Application 10-2019-7035803.
(Continued)

*Primary Examiner* — John J Tabone, Jr.
(74) *Attorney, Agent, or Firm* — Harness, Dickey & Pierce, P.L.C.

(57) ABSTRACT

A method and a device of selecting a base graph of a low-density parity-check code are provided. The method includes: acquiring a data information length and a channel coding rate of to-be-encoded data; determining a target base graph selection strategy according to the data information length and an information length range of a base graph; determining a target base graph for the to-be-encoded data according to the target base graph selection strategy and the channel coding rate.

15 Claims, 3 Drawing Sheets

(52) U.S. Cl.
CPC ...... *H03M 13/118* (2013.01); *H03M 13/1151* (2013.01); *H03M 13/1154* (2013.01); *H03M 13/1162* (2013.01); *H03M 13/1171* (2013.01); *H03M 13/6516* (2013.01); *H04L 1/00* (2013.01); *H04L 1/0041* (2013.01); *H04L 1/0057* (2013.01)

(58) Field of Classification Search
CPC ......... H03M 13/1162; H03M 13/1171; H03M 13/118; H03M 13/6516; H04L 1/0057; H04L 1/0041; H04L 1/00
USPC .................................. 714/758, 752, 786, 799
See application file for complete search history.

(56) References Cited

U.S. PATENT DOCUMENTS

| | | | |
|---|---|---|---|
| 2007/0162815 | A1 | 7/2007 | El-Khamy et al. |
| 2009/0006906 | A1 | 1/2009 | Jacobsen et al. |
| 2012/0173949 | A1 | 7/2012 | Liu et al. |
| 2017/0230058 | A1 | 8/2017 | Xu et al. |
| 2018/0226988 | A1* | 8/2018 | Soriaga ................ H03M 13/116 |
| 2018/0226989 | A1* | 8/2018 | Soriaga ................ H03M 13/036 |
| 2018/0234114 | A1* | 8/2018 | Soriaga ................ H04L 1/0057 |
| 2018/0278397 | A1* | 9/2018 | Park ...................... H04L 5/0048 |
| 2019/0207710 | A1* | 7/2019 | Ye ....................... H03M 13/6306 |
| 2019/0229751 | A1* | 7/2019 | Kim ........................ H03M 13/11 |
| 2020/0067641 | A1* | 2/2020 | Ma ............................. H04L 1/18 |
| 2020/0119749 | A1* | 4/2020 | Soriaga .............. H03M 13/1137 |
| 2020/0235759 | A1* | 7/2020 | Ye ....................... H03M 13/116 |
| 2020/0304235 | A1* | 9/2020 | Li ............................. H04L 1/00 |

FOREIGN PATENT DOCUMENTS

| | | |
|---|---|---|
| CN | 101567697 A | 10/2009 |
| CN | 102025441 A | 4/2011 |
| CN | 104158550 A | 11/2014 |
| CN | 104868925 A | 8/2015 |
| CN | 106341138 A | 1/2017 |
| KR | 20070020039 A | 2/2007 |
| TW | 201126961 A | 8/2011 |
| WO | 2012037749 A1 | 3/2012 |

OTHER PUBLICATIONS

Text of the Notification of the First Office Action, Subject: Patent Application No. 107114402 Has Been Reviewed as Described in Note 1.
3GPP TSG Ran WG1 Meeting #88BIS, R1-1704382, Spokane, USA, Apr. 3-7, 2017, Agenda Item 8.1.4.1.2, Source: ZTE, ZTE Microfielectronics, Title: Further Consideration on Compact LDPC Design for EMBB, Document For: Discussion and Decision.
3GPP TSG Ran WG1 Meeting #88bis, R1-1704590, Spokane, USA, Apr. 3-7, 2017, Source: CATT, Title: LDPC Design for eMBB data channel, Agenda Item: 8.1.4.1.2, Document for: Decision.
3GPP TSG-Ran WG1 #86, R1-166388, Aug. 22-26, 2016, Gothenburg, Sweden, Agenda Item 8.1.4.1, Source: Qualcomm Incorporated, Title: LDPC Rate Compatible Design, Document for: Discussion/Decision.
The State Intellectual Property Office of People's Republic of China, China Academy of Telecommunications Technology, Title of Invention: Base Graph Selection Method and Device for Low Density Parity Check Codes, First Office Action, Publication Date: Aug. 13, 2016.
European Patent Office, Munich, Germany, dated Mar. 4, 2020, PCT/CN2018083743, China Academy of Telecommunications Technology, Communication, Extended European Search Report.
3GPP TSG-Ran WG1 NR Ad Hoc R1-1700830, Jan. 16-20, 2017, Spokane, USA, Agenda item: 5.1.5.1, Source: Qualcomm Incorporated, Title: LDPC rate compatible design, Document for: Discussion/Decision.
3GPP TSG-Ran WG1 NR AdHoc R1-1700831, Jan. 16-20, 2017, Spokane, USA, Agenda item: 5.1.5.1, Souice: Qualcomm Incorporated, Title: LDPC Design Considerations, Document for: Discussion/Decision.
Patent Cooperation Treaty, Advance E-Mail, PCT, Notification of Transmittal of Translation of the International Preliminary Report on Patentability, dated Nov. 14, 2019, PCT/CN2018/083743, China Academy of Telecommunications Technology, Authorized Officer: Xiaofan Tang.

* cited by examiner

METHOD AND DEVICE OF SELECTING BASE GRAPH OF LOW-DENSITY PARITY-CHECK CODE

CROSS-REFERENCE TO RELATED APPLICATION

This application is a U.S. national phase application of a PCT Application No. PCT/CN2018/083743 filed on Apr. 19, 2018, which claims a priority to a Chinese Patent Application No. 201710314028.6 filed in China on May 5, 2017 and a Chinese Patent Application No. 201710367204.2 filed in China on May 23, 2017, the disclosures of which are incorporated by reference in their entireties.

TECHNICAL FIELD

The present disclosure relates to the field of communication technology, and in particular, relates to a method and a device of selecting a base graph of a low-density parity-check code.

BACKGROUND

A $3^{rd}$ Generation Partnership Project (3GP) uses a Low-Density Parity-Check (LDPC) code for an Enhanced Mobile Broadband (eMBB) application scenario in a Fifth Generation (5G) New Radio (NR).

A lifting method is used for a base graph of the LDPC code to acquiring a check matrix supporting a specific information length and a specific code rate to be used for encoding and decoding. Due to limitations of the base graph and lifting parameters, the information length and the code rate supportable by the check matrix may be limited within ranges, respectively. Therefore, the ranges of the information length and the code rate supported by a determined base graph are also determined. Different base graphs may support different information lengths and code rates.

Based on a conclusion from a 3GPP conference, an LDPC coding scheme with two base graphs may be used in the NR, wherein since the two base graphs need cover all code lengths and code rates, ranges of an information length and a code rate supported by one of the two base graphs are different from and overlapped with ranges of an information length and a code rate supported by the other of the two base graphs.

However, before a base graph is selected, a base station and a terminal acquiring a Modulation and Coding Scheme (MCS) information in Downlink Control Information (DCI), query a stored MCS table to acquiring a Transport Block Size (TBs) and a value of a target R, and calculate a segmentation result to acquiring targets K and R used in a LDPC encoding and decoding.

It may be known from this that the targets K, R are calculated based on a length of data to be transmitted and physical resources that may be provided by a channel. Therefore, when a base graph is to be selected based on the targets K, R, and ranges of the information length and the code rate supported by the above two base graphs, some combinations of a length of data to be transmitted and a channel coding rate may not be covered or repeatedly covered, and there is a problem that a base graph required for encoding data cannot be explicitly selected.

SUMMARY

An objective of the present disclosure is to provide a method and a device of selecting a base graph of a low-density parity-check code, so as to solve a problem that a base graph required for encoding and decoding cannot be explicitly selected from two base graphs.

To achieve the above objective, in a first aspect, some embodiments of the present disclosure provide a method of selecting a base graph of a low-density parity-check code. The method includes acquiring a data information length and a channel coding rate of to-be-encoded data; determining a target base graph selection strategy according to the data information length and an information length range of a base graph; and determining a target base graph for the to-be-encoded data according to the target base graph selection strategy and the channel coding rate.

Optionally, determining the target base graph selection strategy according to the data information length and the information length range of the base graph, includes: acquiring a first minimum information length Kmin1 and a first maximum information length Kmax1 of a first graph in the base graph; acquiring a second minimum information length Kmin2 and a second maximum information length Kmax2 of a second graph in the base graph; and determining the target base graph selection strategy based on a size relation among the data information length K and the first minimum information length, the first maximum information length, the second minimum information length, and the second maximum information length, wherein Kmin2<Kmin1≤Kmax2<Kmax1.

Optionally, determining the target base graph selection strategy based on the size relation among the data information length K and the first minimum information length, the first maximum information length, the second minimum information length, and the second maximum information length, includes: determining the target base graph selection strategy to be a first base graph selection strategy in a case that Kmin2≤K<Kmin1; determining the target base graph selection strategy to be a second base graph selection strategy in a case that Kmin1≤K≤Kmax2; and determining the target base graph selection strategy to be a third base graph selection strategy in a case that Kmax2<K≤Kmax1.

Optionally, determining the target base graph for the to-be-encoded data according to the target base graph selection strategy and the channel coding rate, includes: acquiring a first minimum coding rate Rmin1 and a first maximum coding rate Rmax1 of the first graph in the base graph; acquiring a second minimum coding rate Rmin2 and a second maximum coding rate Rmax2 of the second graph in the base graph; comparing the channel coding rate R with the first minimum coding rate, the first maximum coding rate, the second minimum coding rate and the second maximum coding rate, and acquiring a result of the comparison; and determining the target base graph based on the target base graph selection strategy and the result of the comparison, wherein, Rmin2<Rmin1<Rmax2<Rmax1.

Optionally, determining the target base graph based on the target base graph selection strategy and the result of the comparison, includes: selecting the second graph as the target base graph if Rmin2≤R≤Rmax2, in a case that the target base graph selection strategy is a first base graph selection strategy.

Optionally, determining the target base graph based on the target base graph selection strategy and the result of the comparison, includes: selecting the first graph as the target base graph if Rmax2<R≤Rmax1, in a case that the target base graph selection strategy is a first base graph selection strategy.

Optionally, determining the target base graph based on the target base graph selection strategy and the result of the comparison, includes: selecting the second graph as the target base graph if $Rmin2 \leq R \leq Rmax2$, in a case that the target base graph selection strategy is a second base graph selection strategy and $Kmin1=Kmax2$.

Optionally, determining the target base graph based on the target base graph selection strategy and the result of the comparison, includes: selecting the first graph as the target base graph if $Rmax2<R \leq Rmax1$, in a case that the target base graph selection strategy is a second base graph selection strategy and $Kmin1=Kmax2$.

Optionally, determining the target base graph based on the target base graph selection strategy and the result of the comparison, includes: selecting the second graph as the target base graph if $Rmin2 \leq R<Rmin1$, in a case that the target base graph selection strategy is a second base graph selection strategy and $Kmin1<Kmax2$.

Optionally, determining the target base graph based on the target base graph selection strategy and the result of the comparison, includes: selecting the first graph as the target base graph if $Rmax2 \leq R \leq Rmax1$, in a case that the target base graph selection strategy is a second base graph selection strategy and $Kmin1<Kmax2$.

Optionally, determining the target base graph based on the target base graph selection strategy and the result of the comparison, includes: in a case that the target base graph selection strategy is a second base graph selection strategy and $Kmin1<Kmax2$, if $Rmin1 \leq R<Rmax2$, then determining a preset information length value K0 and a preset coding rate value R0 based on a block error performance of the target base graph and a delay performance affected by a lifting parameter of the target base graph, and comparing the data information length with the preset information length value K0 and comparing the channel coding rate with the preset coding rate value R0, selecting the first graph as the target base graph if $K0 \leq K<Kmax2$ and $R0 \leq R<Rmax2$, selecting the second graph as the target base graph if $K<K0$ or $R<R0$.

Optionally, determining the target base graph based on the target base graph selection strategy and the result of the comparison, includes: in a case that the target base graph selection strategy is a third base graph selection strategy, if $Rmin2 \leq R<Rmin1$ and the first graph supports encoding performed by using K less than Kmax1 and R less than Rmin1 in a case of $K/R \leq Nmax$, then selecting the first graph as the target base graph, wherein $Nmax=Kmax1/Rmin1$.

Optionally, determining the target base graph based on the target base graph selection strategy and the result of the comparison, includes: selecting the first graph as the target base graph if $Rmin1 \leq R \leq Rmax1$, in a case that the target base graph selection strategy is a third base graph selection strategy.

Optionally, after determining the target base graph for the to-be-encoded data, the method further includes: generating a check matrix for the to-be-encoded data based on the target base graph, a target information length, and a target coding rate.

Optionally, the target information length is acquired by adding the data information length with Kmin1−K zeros in a case that $Kmin2 \leq K<Kmin1$ and $Rmax2<R \leq Rmax1$; otherwise, the target information length is equal to the data information length; wherein K denotes the data information length, Kmin1 denotes a first minimum information length of a first graph in the base graph, Kmin2 denotes a second minimum information length of a second graph in the base graph, R denotes the channel coding rate, Rmax1 denotes a first maximum coding rate of the first graph, and Rmax2 denotes a second maximum coding rate of the second graph.

Optionally, the target coding rate is equal to the channel coding rate.

To achieve the above objective, in a second aspect, some embodiments of the present disclosure further provide a device of selecting a base graph of a low-density parity-check code. The device includes an acquisition module, configured to acquire a data information length and a channel coding rate of to-be-encoded data; a first determination module, configured to determine a target base graph selection strategy according to the data information length and an information length range of a base graph; and a second determination module, configured to determine a target base graph for the to-be-encoded data according to the target base graph selection strategy and the channel coding rate.

Optionally, the first determination module includes: a first acquisition submodule, configured to acquire a first minimum information length Kmin1 and a first maximum information length Kmax1 of a first graph in the base graph; a second acquisition submodule, configured to acquire a second minimum information length Kmin2 and a second maximum information length Kmax2 of a second graph in the base graph; and a first determination submodule, configured to determine the target base graph selection strategy based on a size relation among the data information length K and the first minimum information length, the first maximum information length, the second minimum information length, and the second maximum information length, wherein $Kmin2<Kmin1 \leq Kmax2<Kmax1$.

Optionally, the first determination submodule includes: a first determination unit, configured to determine the target base graph selection strategy to be a first base graph selection strategy in a case that $Kmin2 \leq K<Kmin1$; a second determination unit, configured to determine the target base graph selection strategy to be a second base graph selection strategy in a case that $Kmin1 \leq K \leq Kmax2$; and a third determination unit, configured to determine the target base graph selection strategy to be a third base graph selection strategy in a case that $Kmax2<K \leq Kmax1$.

Optionally, the second determination module includes: a third acquisition submodule, configured to acquire a first minimum coding rate Rmin1 and a first maximum coding rate Rmax1 of the first graph in the base graph; a fourth acquisition submodule, configured to acquire a second minimum coding rate Rmin2 and a second maximum coding rate Rmax2 of the second graph in the base graph; a comparison submodule, configured to compare the channel coding rate R with the first minimum coding rate, the first maximum coding rate, the second minimum coding rate and the second maximum coding rate, and acquire a result of the comparison; and a second determination submodule, configured to determine the target base graph based on the target base graph selection strategy and the result of the comparison, wherein, $Rmin2<Rmin1<Rmax2<Rmax1$.

Optionally, the second determination submodule includes: a first selection unit, configured to select the second graph as the target base graph if $Rmin2 \leq R \leq Rmax2$, in a case that the target base graph selection strategy is a first base graph selection strategy.

Optionally, the second determination submodule includes: a second selection unit, configured to select the first graph as the target base graph if $Rmax2<R \leq Rmax1$, in a case that the target base graph selection strategy is a first base graph selection strategy.

Optionally, the second determination submodule includes: a third selection unit, configured to select the second graph as the target base graph if $Rmin2 \leq R \leq Rmax2$, in a case that the target base graph selection strategy is a second base graph selection strategy and Kmin1=Kmax2.

Optionally, the second determination submodule includes: a third selection unit, configured to select the first graph as the target base graph if Rmax2<R≤Rmax1, in a case that the target base graph selection strategy is a second base graph selection strategy and Kmin1=Kmax2.

Optionally, the second determination submodule includes: a fourth selection unit, configured to select the second graph as the target base graph if Rmin2≤R<Rmin1, in a case that the target base graph selection strategy is a second base graph selection strategy and Kmin1<Kmax2.

Optionally, the second determination submodule includes: a fifth selection unit, configured to select the first graph as the target base graph if Rmax2≤R≤Rmax1, in a case that the target base graph selection strategy is a second base graph selection strategy and Kmin1<Kmax2.

Optionally, the second determination submodule includes: a sixth selection unit, configured to: in a case that the target base graph selection strategy is a second base graph selection strategy and Kmin1<Kmax2, if Rmin1≤R<Rmax2, then determine a preset information length value K0 and a preset coding rate value R0 based on a block error performance of the target base graph and a delay performance affected by a lifting parameter of the target base graph, and compare the data information length with the preset information length value K0 and compare the channel coding rate with the preset coding rate value R0, select the first graph as the target base graph if K0≤K<Kmax2 and R0≤R<Rmax2, select the second graph as the target base graph if K<K0 or R<R0.

Optionally, the second determination submodule includes: a seventh selection unit, configured to: in a case that the target base graph selection strategy is a third base graph selection strategy, if Rmin2≤R<Rmin1 and the first graph supports encoding performed by using K less than Kmax1 and R less than Rmin1 in a case of K/R≤Nmax, then select the first graph as the target base graph, wherein Nmax=Kmax1/Rmin1.

Optionally, the second determination submodule includes: an eighth selection unit, configured to select the first graph as the target base graph if Rmin1≤R≤Rmax1, in a case that the target base graph selection strategy is a third base graph selection strategy.

Optionally, the device further includes: a generation module, configured to generate a check matrix for the to-be-encoded data based on the target base graph, a target information length, and a target coding rate.

Optionally, the target information length is acquired by adding the data information length with Kmin1−K zeros in a case that Kmin2≤K<Kmin1 and Rmax2<R≤Rmax1; otherwise, the target information length is equal to the data information length; wherein K denotes the data information length, Kmin1 denotes a first minimum information length of a first graph in the base graph, Kmin2 denotes a second minimum information length of a second graph in the base graph, R denotes the channel coding rate, Rmax1 denotes a first maximum coding rate of the first graph, and Rmax2 denotes a second maximum coding rate of the second graph.

Optionally, the target coding rate is equal to the channel coding rate.

In a third aspect, the present disclosure further provides a device of selecting a base graph of a low-density parity-check code. The device includes: a processor, a storage, and a bus interface, wherein the bus interface is configured to connect the processor with the storage, the storage is configured to store a program and data, the processor is configured to read the program and the data stored in the storage to control the device to perform the method according to the first aspect.

In a fourth aspect, the present disclosure further provides a non-volatile computer readable storage medium. The medium includes a program and an instruction stored on the non-volatile computer-readable storage medium, wherein a processor of a computer implements the method according to the first aspect in a case that the program and the instruction are executed by a processor.

An advantage effect of the technical solutions of the present disclosure is as follows.

Through the method of selecting a base graph of a low-density parity-check code provided in the embodiments of the present disclosure, the data information length and the channel coding rate of the to-be-encoded data are acquired firstly, and then a suitable target base graph selection strategy is determined based on the data information length and an information length range of a base graph, and further the target base graph of the to-be-encoded data is finally determined according to the target base graph selection strategy and the channel coding rate. A case that a target base graph needing to be used cannot be identified because some combinations of data information lengths and channel coding rates cannot be covered by, or repeatedly covered by respective information lengths and coding rates supported by base graphs. Therefore, the target base graph is more efficiently determined.

DETAILED DESCRIPTION

In order to make technical problems, technical solutions and advantages to be solved by the present disclosure clearer, detailed description will be made with reference to accompanying drawings and specific embodiments below.

Directed to a problem that a base graph required for encoding data cannot be explicitly selected in a related base graph selection method, the present disclosure provides a method of selecting a base graph of a low-density parity-check code. An appropriate selection strategy is selected based on a range of an information length of a base graph, and accordingly, a target base graph for the encoded data is determined more clearly.

Figure 1:
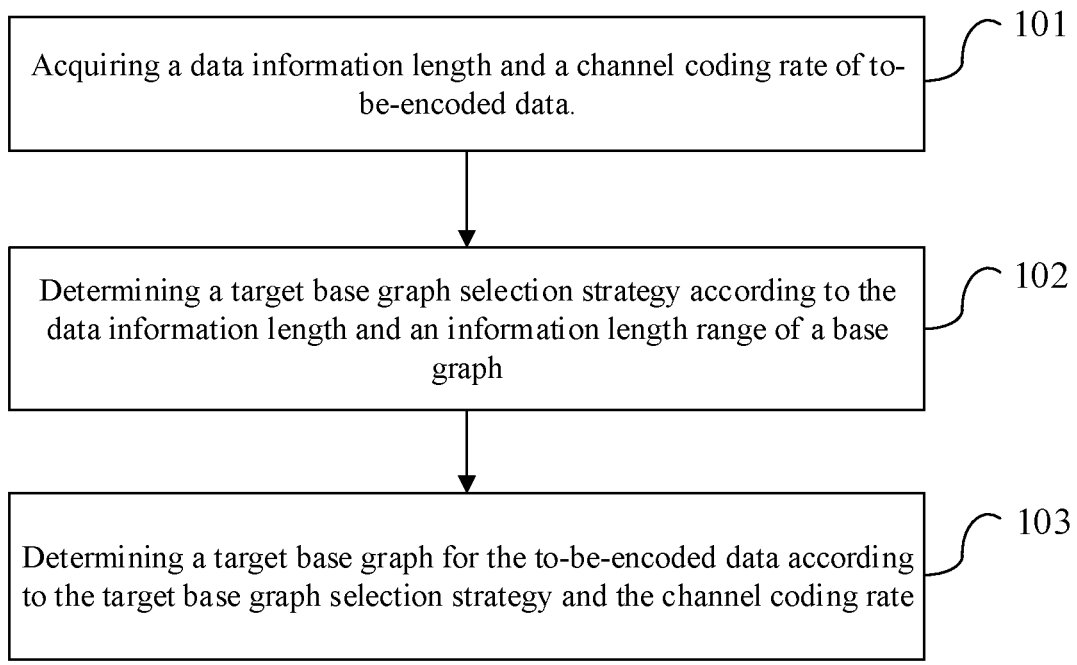
FIG. 1 is a flowchart of steps of a method of selecting a base graph of a low-density parity-check code provided by some embodiments of the present disclosure.

As shown in FIG. 1, a method of selecting a base graph of a low-density parity-check code provided by some embodiments of the present disclosure includes steps 101-103.

Step 101: acquiring a data information length and a channel coding rate of to-be-encoded data.

Step 102: determining a target base graph selection strategy according to the data information length and an information length range of a base graph.

Step 103: determining a target base graph for the to-be-encoded data according to the target base graph selection strategy and the channel coding rate.

Since base graphs to be selected have respective supported information lengths and coding rates, a target base graph selection strategy is determined for different information length ranges in this embodiment. In this way, through the above steps 101-103, after a mobile terminal or a base station knows the data information length and the channel coding rate of the to-be-encoded data, the mobile terminal or the base station may determine a suitable target base graph selection strategy based on a data information length and an information length range of a base graph, and then the target base graph of the to-be-encoded data is finally determined according to the target base graph selection strategy and the channel coding rate. A case that a target base graph needing to be used cannot be identified because some combinations of data information lengths and channel coding rates cannot be covered by, or repeatedly covered by respective information lengths and coding rates supported by base graphs. Therefore, the target base graph is more efficiently determined.

It should be appreciated that, according to a conclusion of a 3GPP conference, a LDPC coding scheme with two base graphs is optionally used in a NR. wherein, a first base graph #1 supports an information length [Kmin1, Kmax1] and a coding rate range [Rmin1, Rmax1]; and a second base graph #2 supports an information length [Kmin2, Kmax2] and a coding rate range [Rmin2, Rmax2], wherein Kmin1 denotes a first minimum information length of the first base graph, Kmax1 denotes a first maximum information length of the first base graph, Rmin1 denotes a first minimum coding rate of the first base graph, Rmax1 represents a first maximum coding rate of the first base graph; Kmin2 denotes a second minimum information length of the second base graph, Kmax2 denotes a second maximum information length of the second base graph, Rmin1 denotes a second minimum coding rate of the second base graph, Rmax2 represents a second maximum coding rate of the second base graph. Kmin2<Kmin1≤Kmax2<Kmax1 and Rmin2<Rmin1<Rmax2<Rmax1 because the two base graphs are to cover all information lengths and coding rates of encoded data. Kmin2 is equal to a minimum information length Kmin of the encoded data, Kmax1 is equal to a maximum information length Kmax of the encoded data, Rmin2 is equal to a minimum coding rate Rmin of the encoded data, and Rmax1 is equal to a maximum coding rate Rmax of the encoded data.

Figure 2:
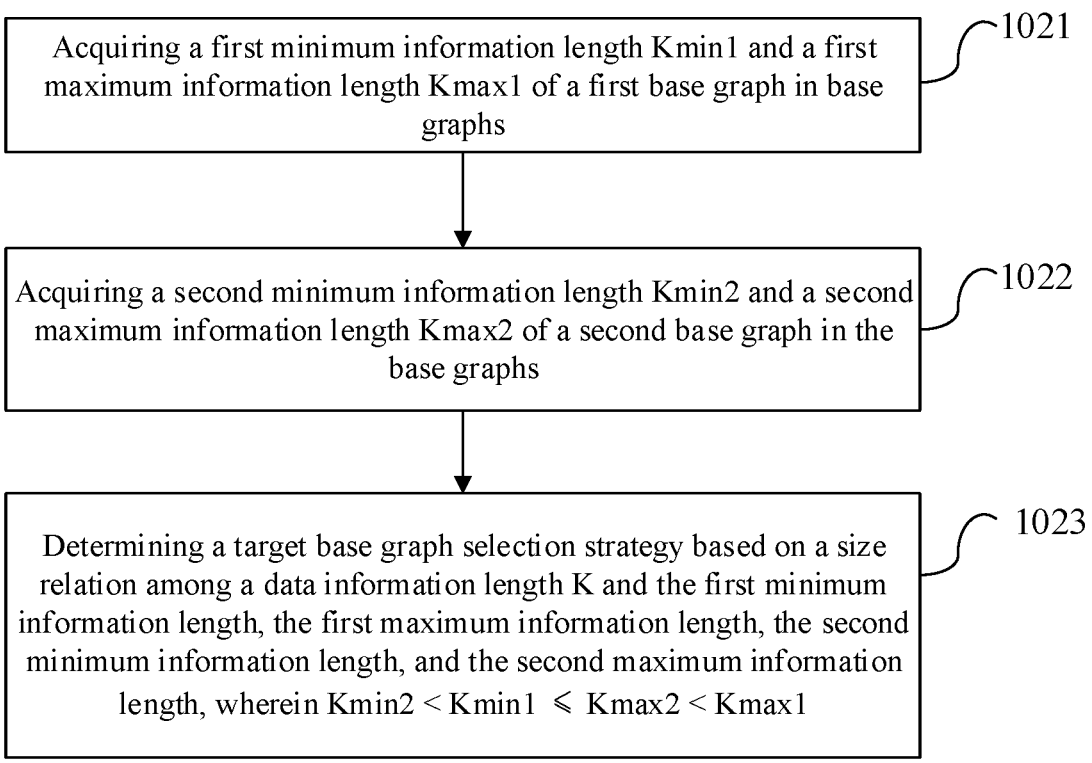
FIG. 2 is a flowchart of specific steps of the method of selecting a base graph of a low-density parity-check code provided by some embodiments of the present disclosure.

As may be seen from the above, in the embodiments of the present disclosure, the base graph selection strategy is configured to correspond to an information length range of a base graph, and thus, specifically, as shown in FIG. 2, in the embodiments of the present disclosure, the step 102 includes sub-steps 1021-1023.

Sub-step 1021: acquiring a first minimum information length Kmin1 and a first maximum information length Kmax1 of the first base graph in the base graphs.

Sub-step 1022: acquiring a second minimum information length Kmin2 and a second maximum information length Kmax2 of the second base graph in the base graphs.

Sub-step 1023: determining a target base graph selection strategy based on a size relation among a data information length K and the first minimum information length, the first maximum information length, the second minimum information length, and the second maximum information length, wherein Kmin2<Kmin1≤Kmax2<Kmax1.

Herein, through the sub-steps 1021-1023, the mobile terminal or the base station acquire the minimum information lengths and the maximum information lengths of the first base graph and the second base graph in the base graphs respectively, and then, according to the size relations among the data information length and the acquired information lengths, a suitable target base graph selection strategy is determined.

Optionally, the sub-step 1023 includes, in a case that Kmin2≤K<Kmin1, determining the target base graph selection strategy to be a first base graph selection strategy; in a case that Kmin1≤K≤Kmax2, determining the target base graph selection strategy to be a second base graph selection strategy; in a case that Kmax2<K≤Kmax1, determining the target base graph selection strategy to be a third base graph selection strategy.

Here, based on a range suitable for the configured base graph selection strategy and a data information length, the target base graph selection strategy for performing a final base graph selection for the to-be-encoded data may be firstly determined to determine the target base graph.

Figure 3:
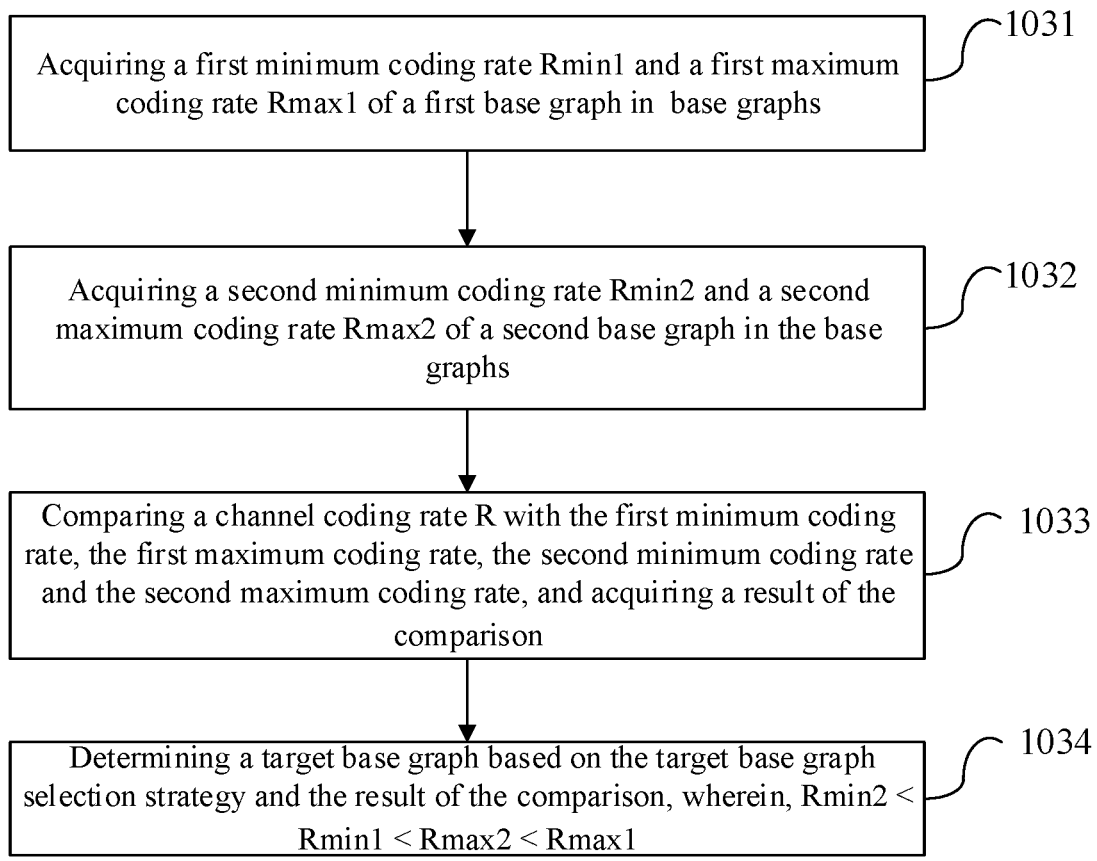
FIG. 3 is a flowchart of specific steps of the method of selecting a base graph of a low-density parity-check code provided by some embodiments of the present disclosure.

It should also be understood that, in the embodiments of the present disclosure, determination of the target base graph is implemented based on the target base graph selection strategy and the channel coding rate, specifically, as shown in FIG. 3, the step 103 includes sub-steps 1031-1034.

Sub-step 1031: acquiring a first minimum coding rate Rmin1 and a first maximum coding rate Rmax1 of the first base graph in the base graphs.

Sub-step 1032: acquiring a second minimum coding rate Rmin2 and a second maximum coding rate Rmax2 of the second base graph in the base graphs.

Sub-step 1033: comparing a channel coding rate R with the first minimum coding rate, the first maximum coding rate, the second minimum coding rate and the second maximum coding rate, and acquiring a result of the comparison.

Sub-step 1034: determining the target base graph based on the target base graph selection strategy and the result of the comparison, wherein, Rmin2<Rmin1<Rmax2<Rmax1.

According to the above steps, firstly, the minimum coding rates and the maximum coding rates of the first and second base graphs are acquired, and then the channel coding rate is compared with each of the coding rates, and then, according to the result of the comparison and the determined the target base graph selection strategy, the target base graph is determined.

Optionally, the sub-step 1034 includes selecting the second base graph as the target base graph if Rmin2≤R≤Rmax2, in a case that the target base graph selection strategy is the first base graph selection strategy.

Here, in a case that the determined target base graph selection strategy is the first base graph selection strategy, if Rmin2≤R≤Rmax2 is further known through the result of the comparison, then the second base graph is determined to be selected. That is, the base graph #2 is used as a target base graph.

Optionally, the sub-step 1034 includes selecting the first base graph as the target base graph if Rmax2<R≤Rmax1, in a case that the target base graph selection strategy is the first base graph selection strategy.

Here, in a case that the determined target base graph selection strategy is the first base graph selection strategy, and if $Rmax2 < R \leq Rmax1$ is further known through the result of the comparison, the first base graph is determined to be selected. That is, base graph #1 is selected as the target base graph.

For example, $Kmax1=8448$, $Kmax2=2000$, $Kmin1=512$, $Kmin2=100$, $Rmin1=\frac{1}{3}$, $Rmax1=\frac{8}{9}$, $Rmin2=\frac{1}{5}$, $Rmax2=\frac{2}{3}$, an information length unit is bit, a coding rate unit is kbps. In a case that a K and a R corresponding to the to-be-encoded data are $K=500$ and $R=\frac{5}{6}$, according to the above method and from $Kmin2 \leq K < Kmin1$, it is determined firstly that the target base graph selection strategy is the first base graph selection strategy, and then, in the first base graph selection strategy, since $Rmax2 < R \leq Rmax1$, then the base graph #2 is determined to be selected as the target base graph for the to-be-encoded data.

Optionally, the sub-step 1034 includes: selecting the second base graph as the target base graph if $Rmin2 \leq R \leq Rmax2$, in a case that the target base graph selection strategy is the second base graph selection strategy and $Kmin1=Kmax2$.

Here, the determined target base graph selection strategy is the second base graph selection strategy, and $Kmin1=Kmax2$. In a case that $Rmin2 \leq R \leq Rmax2$ is further known through the result of the comparison, the second base graph is determined to be selected. That is, the base graph #2 is selected as the target base graph.

Optionally, the sub-step 1034 includes: in a case that the target base graph selection strategy is the second base graph selection strategy and $Kmin1=Kmax2$, if $Rmax2 < R \leq Rmax1$, then selecting the first base graph as the target base graph.

Here, the determined target base graph selection strategy is the second base graph selection strategy and $Kmin1=Kmax2$. The first base graph is determined to be selected if $Rmax2 < R \leq Rmax1$ is further known through the result of the comparison. That is, the base graph #1 is selected as the target base graph.

Optionally, the sub-step 1034 includes selecting the second base graph as the target base graph if $Rmin2 \leq R < Rmin1$, in a case that the target base graph selection strategy is the second base graph selection strategy and $Kmin1 < Kmax2$.

Here, in a case that the determined target base graph selection strategy is the second base graph selection strategy and $Kmin1 < Kmax2$, if $Rmin2 \leq R < Rmin1$ is further known through the result of the comparison, the second base graph is determined to be selected. That is, the base graph #2 is selected as the target base graph.

Optionally, the sub-step 1034 includes: selecting the first base graph as the target base graph if $Rmax2 \leq R \leq Rmax1$, in a case that the target base graph selection strategy is the second base graph selection strategy and $Kmin1 < Kmax2$.

Here, in a case that the determined target base graph selection strategy is the second base graph selection strategy and $Kmin1 < Kmax2$, if $Rmax2 \leq R \leq Rmax1$ is further known from the result of the comparison, the first base graph is determined to be selected. That is, the base graph #1 is selected as the target base graph.

Optionally, the sub-step 1034 includes: in a case that the target base graph selection strategy is the second base graph selection strategy and $Kmin1 < Kmax2$, if $Rmin1 \leq R \leq Rmax2$, then determining a preset information length value K0 and a preset coding rate value R0 based on a block error performance of the target base graph and a delay performance affected by a lifting parameter of the target base graph, and comparing the data information length with the preset information length value K0 and comparing the channel coding rate with the preset coding rate value R0, selecting the first base graph as the target base graph if $K0 \leq K < Kmax2$ and $R0 \leq R < Rmax2$, selecting the second base graph as the target base graph if $K < K0$ or $R < R0$.

Here, in a case that the determined target base graph selection strategy is the second base graph selection strategy and $Kmin1 < Kmax2$, $Rmin1 \leq R < Rmax2$ is further known through the result of the comparison, it is also necessary to compare K with K0 and compare R with R0. The first base graph, i.e. the base graph #1, is selected as the target base graph if $K0 \leq K < Kmax2$ and $R0 \leq R < Rmax2$; the second base graph, i.e., the base graph #2, is selected as the target base graph if $K < K0$ or $R < R0$. Lifting sizes used by the two base graphs are different, considering that a time delay may be reduced by using a larger lifting size, and a performance in a case that the two base graphs are independent are different, therefore, the selection may be performed by setting a threshold value. The preset information length value K0 and the preset coding rate value R0 are determined according to the block error performance of the target base graph and the delay performance affected by the lifting parameters of the base graphs. In this way, settings of K0 and R0 will realize the selected target base graph, so that a larger lifting size, a smaller delay and a better block error performance may be acquired in coding and decoding processes. If the second base graph is specifically optimized for shorter code blocks, and the block error performance is completely better than that of the first base graph in respect of applicable ranges of the information length and the coding rate, then $K0=Kmax2$, $R0=Rmax2$ may be configured to realize that the second base graph is selected as the target base graph; if a lifting size of the second base graph is the largest in respect of the applicable ranges of the information length and the coding rate, then hardware parallelism required for encoding and decoding based on the second base graph is high and the delay is low. Thus, $K0=Kmax2$, $R0=Rmax2$ may also be configured, and the encoding and the decoding are performed by using the second base graph as the target base graph.

Continuing the ranges of the information length and the coding rate supported by the first base graph and the second base graph in the above example, and setting $K0=Kmin1=512$, $R0=Rmin1=\frac{1}{3}$, then all combinations in ranges of $Kmin1 \leq K < Kmax2$ and $Rmin1 \leq R < Rmax2$ with respect to K and R of the acquired to-be-encoded data belong to a case of $K>K0$, $R>R0$, and the first base graph may be determined, that is, the base graph #1, may be selected as the target base graph.

If it is assumed that in the ranges supported by the base graph, $Kmax2=2560$ and the remaining ranges are unchanged, $K0=2000$, $R0=\frac{1}{2}$ may be configured. If $K=2100$, $R=0.6$, then K, R fall in ranges of $Kmin1 \leq K \leq Kmax2$, $Rmin1 \leq R < Rmax2$, which are coincidence ranges of the base graph and $K>K0$, $R>R0$. In such a case, the first base graph, that is, the base graph #1, may be determined as the target base graph. If $K=1900$, $R=0.4$, then K and R fall within ranges of $K<K0$, $R<R0$, the second base graph, i.e., the base graph #2, may be determined as the target base graph.

Optionally, the sub-step 1034 includes: in a case that the target base graph selection strategy is the third base graph selection strategy, if $Rmin2 \leq R < Rmin1$ and the first base graph supports encoding performed by using K less than Kmax1 and R less than Rmin1 in a case of $K/R \leq Nmax$, then selecting the first base graph as the target base graph, wherein $Nmax=Kmax1/Rmin1$.

Here, in a case that the determined target base graph selection strategy is the third base graph selection strategy, and $Rmin2 \leq R < Rmin1$ is further known through the result of the comparison, and in the case of K/R≤Nmax, the first base graph supports encoding performed by using K less than Kmax1 and R less than Rmin1, then the first base graph is selected as the target base graph.

Continuing the ranges of information length and coding rate supported by the first base graph and the second base graph in the above example, it is assumed that the base graph #1, in a case of satisfying K/R≤Nmax, supports encoding performed by using K less than Kmax1 and R less than Rmin1. In such a case, Nmax=Kmax1/Rmin1=8448/(⅓) =25344. In a case that K=6000, R=¼, and K/R=24000<Nmax is satisfied, the first base graph, i.e., the base graph #1, is determined as the target base graph.

Optionally, the sub-step 1034 includes selecting the first base graph as the target base graph if Rmin1≤R≤Rmax1, in a case that the target base graph selection strategy is the third base graph selection strategy.

Here, in a case that the determined target base graph selection strategy is the third base graph selection strategy, and Rmin1≤R≤Rmax1 is further known through the result of the comparison, the first base graph is determined to be selected. That is, the base graph #1 is selected as the target base graph.

Continuing the ranges of information length and coding rate supported by the first base graph and the second base graph in the above example, in a case that K=8448 and R=9/10 corresponding to the to-be-encoded data are acquired, the target base graph selection strategy is determined to be the third base graph selection strategy according to K=Kmax1 firstly through the above method, and then, in the third base graph selection strategy, because Rmin1≤R≤Rmax1, the base graph #1 is determined to be selected as the target base graph for the to-be-encoded data.

After the target base graph selection strategy is determined to be the third base graph selection strategy, and if Rmin2≤R<Rmin1, then the base graph #1 does not support any coding parameter in the range of R<Rmin1, and the base graph #1 and the base graph #2 cannot be used for encoding directly within this range, thus the base graph #2 will be used for encoding. Since a maximum information length supported by the base graph #2 is Kmax2, but K>Kmax2 in this case, a contradiction appears. That is, in a case that the base graph #1 does not support direct encoding for any combination of K and R in the ranges of Kmax2≤K≤Kmax and Rmin2≤R<Rmin1, target K and R will not appear in the ranges.

After determining the target base graph, the method in the embodiment of the present disclosure further includes generating a check matrix for the to-be-encoded data based on the target base graph, a target information length, and a target coding rate.

In order to realize encoding the to-be-encoded data, a check matrix needs to be generated. After the target base graph is determined in step 103, the check matrix is generated based on the target base graph and parameters (i.e., the target information length and the target coding rate).

The target coding rate is equal to the channel coding rate.

For purpose of be adapting to the above method to definitely select the base graph needed for encoding and decoding, the target information length is acquired by adding the data information length with Kmin1−K zeros in a case that Kmin2≤K<Kmin1 and Rmax2<R≤Rmax1; otherwise, the target information length is equal to the data information length; wherein K denotes the data information length, Kmin1 denotes a first minimum information length of a first base graph in the base graphs, Kmin2 denotes a second minimum information length of a second base graph in the base graphs, R denotes the channel coding rate, Rmax1 denotes a first maximum coding rate of the first base graph, and Rmax2 denotes a second maximum coding rate of the second base graph.

Here, in a case that Kmin2≤K<Kmin1 and Rmax2<R≤Rmax1, a new information length acquired by adding the data information length with Kmin1−K zeros is taken as the target information length used in the generation of the check matrix. In other cases, the acquired data information length may be directly used as the target information length.

Continuing the ranges of information length the coding rate supported by the first base graph and the second base graph in the above example, in a case that K=500 and R=⅚ corresponding to the to-be-encoded data are acquired, and after the first base graph is determined as the target base graph, the data information length K is supplemented with zero, Kmin1−K=5012-500=12 zeroes are added to the data information length, and the new information length acquired after zeros are added to the data information length is taken as the target information length used to generate the check matrix.

In summary, according to the method in the embodiments of the disclosure, the data information length and the channel coding rate of the to-be-encoded data are acquired firstly, and then a suitable target base graph selection strategy is determined based on the data information length and an information length range of a base graph, and further the target base graph of the to-be-encoded data is finally determined according to the target base graph selection strategy and the channel coding rate. A case that a target base graph needing to be used cannot be identified because some combinations of data information lengths and channel coding rates cannot be covered by, or repeatedly covered by respective information lengths and coding rates supported by base graphs. Therefore, the target base graph is more efficiently determined.

Figure 4:
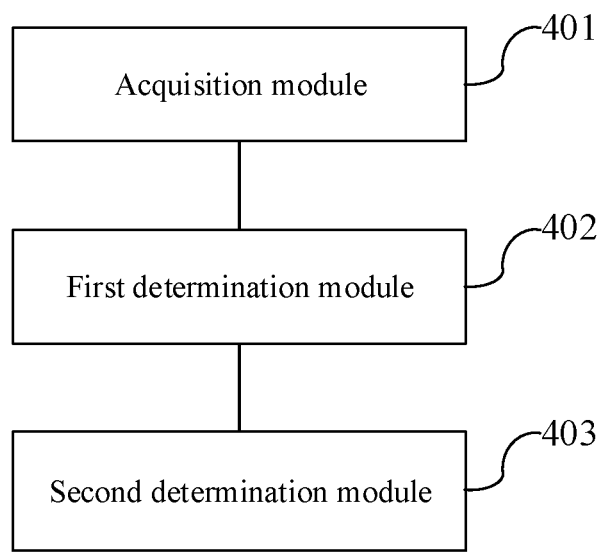
FIG. 4 is a schematic structural diagram of a device of selecting a base graph of a low-density parity-check code provided by some embodiments of the present disclosure.

As shown in FIG. 4, some embodiments of the present disclosure further provide a device of selecting a base graph of a low-density parity-check code. The device includes an acquisition module 401, a first determination module 402, and a second determination module 403.

The acquisition module 401 is configured to acquire a data information length and a channel coding rate of to-be-encoded data. The first determination module 402 is configured to determine a target base graph selection strategy according to the data information length and an information length range of a base graph. The second determination module 403 is configured to determine a target base graph for the to-be-encoded data according to the target base graph selection strategy and the channel coding rate.

Optionally, the first determination module 402 includes a first acquisition submodule, a second acquisition submodule, and a first determination submodule. The first acquisition submodule is configured to acquire a first minimum information length Kmin1 and a first maximum information length Kmax1 of a first base graph in the base graphs. The second acquisition submodule is configured to acquire a second minimum information length Kmin2 and a second maximum information length Kmax2 of a second base graph in the base graphs. The first determination submodule is configured to determine a target base graph selection strategy based on a size relation among a data information length K and the first minimum information length, the first maximum information length, the second minimum information length, and the second maximum information length, wherein Kmin2<Kmin1≤Kmax2<Kmax1.

Optionally, the first determination submodule includes a first determination unit, a second determination unit, and a third determination unit. The first determination unit is configured to, in a case that Kmin2≤K<Kmin1, determine the target base graph selection strategy to be a first base graph selection strategy. The second determination unit is configured to, in a case that Kmin1≤K≤Kmax2, determine the target base graph selection strategy to be a second base graph selection strategy. The third determination unit is configured to, in a case that Kmax2<K≤Kmax1, determine the target base graph selection strategy to be a third base graph selection strategy.

Optionally, the second determination module 403 includes a third acquisition submodule, a fourth acquisition submodule, a comparison submodule, and a second determination submodule. The third acquisition submodule is configured to acquire a first minimum coding rate Rmin1 and a first maximum coding rate Rmax1 of a first base graph in the base graph. The fourth acquisition submodule is configured to acquire a second minimum coding rate Rmin2 and a second maximum coding rate Rmax2 of the second base graph in the base graphs. The comparison submodule is configured to compare a channel coding rate R with the first minimum coding rate, the first maximum coding rate, the second minimum coding rate and the second maximum coding rate, and acquire a result of the comparison. The second determination submodule is configured to determine the target base graph based on the target base graph selection strategy and the result of the comparison, wherein, Rmin2<Rmin1<Rmax2<Rmax1.

Optionally, the second determination submodule includes a first selection unit configured to: select the second base graph as the target base graph if Rmin2≤R≤Rmax2, in a case that the target base graph selection strategy is the first base graph selection strategy.

Optionally, the second determination submodule includes a second selection unit configured to: select the first base graph as the target base graph if Rmax2<R≤Rmax1, in a case that the target base graph selection strategy is the first base graph selection strategy.

Optionally, the second determination submodule includes a third selection unit configured to: select the second base graph as the target base graph if Rmin2≤R≤Rmax2, in a case that the target base graph selection strategy is the second base graph selection strategy and Kmin1=Kmax2.

Optionally, the second determination submodule includes a third selection unit configured to: select the first base graph as the target base graph if Rmax2<R≤Rmax1, in a case that the target base graph selection strategy is the second base graph selection strategy and Kmin1=Kmax2.

Optionally, the second determination submodule includes a fourth selection unit configured to: select the second base graph as the target base graph if Rmin2≤R<Rmin1, in a case that the target base graph selection strategy is the second base graph selection strategy and Kmin1<Kmax2.

Optionally, the second determination submodule includes a fifth selection unit configured to: select the first base graph as the target base graph if Rmax2≤R≤Rmax1, in a case that the target base graph selection strategy is the second base graph selection strategy and Kmin1<Kmax2.

Optionally, the second determination submodule includes a sixth selection unit configured to: in a case that the target base graph selection strategy is the second base graph selection strategy and Kmin1<Kmax2, if Rmin1≤R<Rmax2, then determine a preset information length value K0 and a preset coding rate value R0 based on a block error performance of the target base graph and a delay performance affected by a lifting parameter of the target base graph, and compare the data information length with the preset information length value K0 and compare the channel coding rate with the preset coding rate value R0, select the first base graph as the target base graph if K0≤K<Kmax2 and R0≤R<Rmax2, select the second base graph as the target base graph if K<K0 or R<R0.

Optionally, the second determination submodule includes a seventh selection unit configured to: in a case that the target base graph selection strategy is the third base graph selection strategy, if Rmin2≤R<Rmin1 and the first base graph supports encoding performed by using K less than Kmax1 and R less than Rmin1 in a case of K/R≤Nmax, select the first base graph as the target base graph, wherein Nmax=Kmax1/Rmin1.

Optionally, the second determination submodule includes an eighth selection unit configured to: select the first base graph as the target base graph if Rmin1≤R≤Rmax1, in a case that the target base graph selection strategy is the third base graph selection strategy.

Optionally, the device further includes a generation module configured to: generate a check matrix for the to-be-encoded data based on the target base graph, a target information length, and a target coding rate.

Optionally, the target information length is acquired by adding the data information length with Kmin1−K zeros in a case that Kmin2≤K<Kmin1 and Rmax2<R≤Rmax1; otherwise, the target information length is equal to the data information length; wherein K denotes the data information length, Kmin1 denotes a first minimum information length of a first base graph in the base graphs, Kmin2 denotes a second minimum information length of a second base graph in the base graphs, R denotes the channel coding rate, Rmax1 denotes a first maximum coding rate of the first base graph, and Rmax2 denotes a second maximum coding rate of the second base graph.

The device in the embodiments of the present disclosure firstly acquires a data information length and a channel coding rate of to-be-encoded data, and then determines an appropriate target base graph selection strategy based on the data information length and an information length range of a base graph, and then, a target base graph of the to-be-encoded data is finally determined based on the target base graph selection strategy and the channel coding rate. A case that a target base graph needing to be used cannot be identified because some combinations of data information lengths and channel coding rates cannot be covered by, or repeatedly covered by respective information lengths and coding rates supported by base graphs. Therefore, the target base graph is more efficiently determined.

It should be noted that the device is a device to which the method of selecting a base graph of the low-density parity-check code is applied, and an implementation of the method embodiment is applicable to the device, and a same technical effect may be achieved.

Some embodiments of the present disclosure also provide a non-volatile computer-readable storage medium on which a computer program (an instruction) is stored. When the program (the instruction) is implemented by a processor, the processor achieves following steps: acquiring a data information length and a channel coding rate of to-be-encoded data; determining a target base graph selection strategy according to the data information length and an information length range of a base graph; and determining a target base graph for the to-be-encoded data according to the target base graph selection strategy and the channel coding rate.

Optionally, in a case that the program (the instruction) is implemented by the processor, the following steps may be achieved by the processor: acquiring a first minimum information length Kmin1 and a first maximum information length Kmax1 of a first base graph in the base graphs; acquiring a second minimum information length Kmin2 and a second maximum information length Kmax2 of a second base graph in the base graphs; determining a target base graph selection strategy based on a size relation among a data information length K and the first minimum information length, the first maximum information length, the second minimum information length, and the second maximum information length, wherein Kmin2<Kmin1≤Kmax2<Kmax1.

Optionally, in a case that the program (the instruction) is implemented by the processor, the following steps may be achieved by the processor: in a case that Kmin2≤K<Kmin1, determining the target base graph selection strategy to be a first base graph selection strategy; in a case that Kmin1≤K≤Kmax2, determining the target base graph selection strategy to be a second base graph selection strategy; in a case that Kmax2<K≤Kmax1, determining the target base graph selection strategy to be a third base graph selection strategy.

Optionally, in a case that the program (the instruction) is implemented by the processor, the following steps may be achieved by the processor: acquiring a first minimum coding rate Rmin1 and a first maximum coding rate Rmax1 of the first base graph in the base graphs; acquiring a second minimum coding rate Rmin2 and a second maximum coding rate Rmax2 of the second base graph in the base graphs; comparing a channel coding rate R with the first minimum coding rate, the first maximum coding rate, the second minimum coding rate and the second maximum coding rate, and acquiring a result of the comparison; determining the target base graph based on the target base graph selection strategy and the result of the comparison, wherein, Rmin2<Rmin1<Rmax2<Rmax1.

Optionally, in a case that the program (the instruction) is implemented by the processor, the following steps may be achieved by the processor: selecting the second base graph as the target base graph if Rmin2≤R≤Rmax2, in a case that the target base graph selection strategy is the first base graph selection strategy.

Optionally, in a case that the program (the instruction) is implemented by the processor, the following steps may be achieved by the processor: selecting the first base graph as the target base graph if Rmax2<R≤Rmax1, in a case that the target base graph selection strategy is the first base graph selection strategy.

Optionally, in a case that the program (the instruction) is implemented by the processor, the following steps may be achieved by the processor: selecting the second base graph as the target base graph if Rmin2≤R≤Rmax2, in a case that the target base graph selection strategy is the second base graph selection strategy and Kmin1=Kmax2.

Optionally, in a case that the program (the instruction) is implemented by the processor, the following steps may be achieved by the processor: in a case that the target base graph selection strategy is the second base graph selection strategy and Kmin1=Kmax2, if Rmax2<R≤Rmax1, then selecting the first base graph as the target base graph.

Optionally, in a case that the program (the instruction) is implemented by the processor, the following steps may be achieved by the processor: selecting the second base graph as the target base graph if Rmin2≤R<Rmin1, in a case that the target base graph selection strategy is the second base graph selection strategy and Kmin1<Kmax2.

Optionally, in a case that the program (the instruction) is implemented by the processor, the following steps may be achieved by the processor: selecting the first base graph as the target base graph if Rmax2≤R≤Rmax1, in a case that the target base graph selection strategy is the second base graph selection strategy and Kmin1<Kmax2.

Optionally, in a case that the program (the instruction) is implemented by the processor, the following steps may be achieved by the processor: in a case that the target base graph selection strategy is the second base graph selection strategy and Kmin1<Kmax2, if Rmin1≤R<Rmax2, then determining a preset information length value K0 and a preset coding rate value R0 based on a block error performance of the target base graph and a delay performance affected by a lifting parameter of the target base graph, and comparing the data information length with the preset information length value K0 and comparing the channel coding rate with the preset coding rate value R0, selecting the first base graph as the target base graph if K0≤K<Kmax2 and R0≤R<Rmax2, selecting the second base graph as the target base graph if K<K0 or R<R0.

Optionally, in a case that the program (the instruction) is implemented by the processor, the following steps may be achieved by the processor: in a case that the target base graph selection strategy is the third base graph selection strategy, if Rmin2≤R<Rmin1 and the first base graph supports encoding performed by using K less than Kmax1 and R less than Rmin1 in a case of K/R≤Nmax, then selecting the first base graph as the target base graph, wherein Nmax=Kmax1/Rmin1.

Optionally, in a case that the program (the instruction) is implemented by the processor, the following steps may be achieved by the processor: selecting the first base graph as the target base graph if Rmin1≤R≤Rmax1, in a case that the target base graph selection strategy is the third base graph selection strategy.

Optionally, in a case that the program (the instruction) is implemented by the processor, the following steps may be achieved by the processor: generating a check matrix for the to-be-encoded data based on the target base graph, a target information length, and a target coding rate.

Optionally, the target information length is acquired by adding the data information length with Kmin1−K zeros in a case that Kmin2≤K<Kmin1 and Rmax2<R≤Rmax1; otherwise, the target information length is equal to the data information length; wherein K denotes the data information length, Kmin1 denotes a first minimum information length of a first base graph in the base graphs, Kmin2 denotes a second minimum information length of a second base graph in the base graphs, R denotes the channel coding rate, Rmax1 denotes a first maximum coding rate of the first base graph, and Rmax2 denotes a second maximum coding rate of the second base graph.

Optionally, the target coding rate is equal to the channel coding rate.

The non-volatile computer-readable medium includes a permanent medium and a non-permanent medium, a removable medium and a non-removable medium, and may implement information storage by using any method or technique. The information may be a computer readable instruction, a data structure, a module of a program, or other data. Examples of a computer storage medium include, but are not limited to, a Phase-change Random Access Memory (PRAM), a Static Random Access Memory (SRAM), a Dynamic Random Access Memory (DRAM), other types of Random Access Memories (RAM), a Read Only Memory (ROM), an Electrically Erasable Programmable Read Only Memory (EEPROM), a flash memory, or other memory technology, a Compact Disc Read-Only Memory (CD-ROM), a Digital Versatile Disc (DVD) or other optical storages, a Magnetic-tape cassette, a magnetic tape-magnetic disk storage or other magnetic storage devices or any other non-transmission medium that may be used to store information accessible by a computing device. As defined herein, a computer-readable medium does not include a transitory computer-readable media, such as modulated data signals and carriers.

Figure 5:
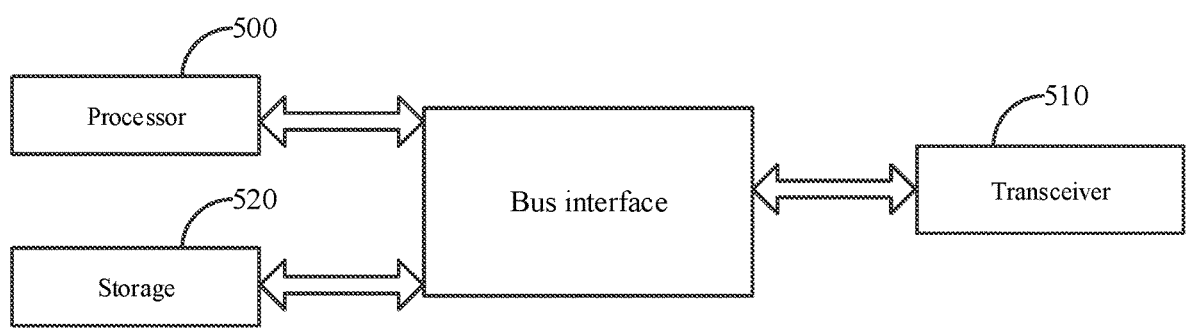
FIG. 5 is a schematic structural diagram of a data encoding device provided by some embodiments of the present disclosure.

As shown in FIG. 5, some embodiments of the present disclosure also provide a data encoding device (a mobile terminal or a base station). The data encoding device includes a processor 500, a storage 520 and a transceiver 510. The processor 500 is configured to read a program in a storage 520 and perform the following steps: acquiring a data information length and a channel coding rate of to-be-encoded data; determining a target base graph selection strategy according to the data information length and an information length range of a base graph; and determining a target base graph for the to-be-encoded data according to the target base graph selection strategy and the channel coding rate.

The transceiver 510 is configured to receive and transmit data under a control of the processor 500.

In FIG. 5, a bus architecture may include any number of interconnected buses and bridges. Specifically, various circuits such as one or more processors represented by the processor 500 and a storage represented by the storage 520 are linked together. The bus architecture may also link together a variety of other circuits, such as a peripheral device, a voltage regulator, and a power management circuit, which are well known in the art and, therefore, will not be described further herein. A bus interface provides an interface. The transceiver 510 may be a plurality of elements, including a transmitter and a receiver, for providing a means for communicating with various other devices over a transmission medium. The processor 500 is responsible for managing the bus architecture and general processings, and the storage 520 may store data used by the processor 500 when the processor 500 performs operations.

Optionally, the processor 500 is further configured to: acquire a first minimum information length Kmin1 and a first maximum information length Kmax1 of a first base graph in the base graphs; acquire a second minimum information length Kmin2 and a second maximum information length Kmax2 of a second base graph in the base graphs; determine a target base graph selection strategy based on a size relation among a data information length K and the first minimum information length, the first maximum information length, the second minimum information length, and the second maximum information length, wherein Kmin2<Kmin1≤Kmax2<Kmax1.

Optionally, the processor 500 is further configured to: in a case that Kmin2≤K<Kmin1, determine the target base graph selection strategy to be a first base graph selection strategy; in a case that Kmin1≤K≤Kmax2, determine the target base graph selection strategy to be a second base graph selection strategy; in a case that Kmax2<K≤Kmax1, determine the target base graph selection strategy to be a third base graph selection strategy.

Optionally, the processor 500 is further configured to: acquire a first minimum coding rate Rmin1 and a first maximum coding rate Rmax1 of a first base graph in the base graphs; acquire a second minimum coding rate Rmin2 and a second maximum coding rate Rmax2 of a second base graph in the base graphs; compare a channel coding rate R with the first minimum coding rate, the first maximum coding rate, the second minimum coding rate and the second maximum coding rate, and acquire a result of the comparison; determine a target base graph based on the target base graph selection strategy and the result of the comparison, wherein, Rmin2<Rmin1<Rmax2<Rmax1.

Optionally, the processor 500 is further configured to: select the second base graph as the target base graph if Rmin2≤R≤Rmax2, in a case that the target base graph selection strategy is the first base graph selection strategy.

Optionally, the processor 500 is further configured to: select the first base graph as the target base graph if Rmax2<R≤Rmax1, in a case that the target base graph selection strategy is the first base graph selection strategy.

Optionally, the processor 500 is further configured to: select the second base graph as the target base graph if Rmin2≤R≤Rmax2, in a case that the target base graph selection strategy is the second base graph selection strategy and Kmin1=Kmax2.

Optionally, the processor 500 is further configured to: in a case that the target base graph selection strategy is the second base graph selection strategy and Kmin1=Kmax2, if Rmax2<R≤Rmax1, then select the first base graph as the target base graph.

Optionally, the processor 500 is further configured to: select the second base graph as the target base graph if Rmin2≤R<Rmin1, in a case that the target base graph selection strategy is the second base graph selection strategy and Kmin1<Kmax2.

Optionally, the processor 500 is further configured to: select the first base graph as the target base graph if Rmax2≤R≤Rmax1, in a case that the target base graph selection strategy is the second base graph selection strategy and Kmin1<Kmax2.

Optionally, the processor 500 is further configured to: in a case that the target base graph selection strategy is the second base graph selection strategy and Kmin1<Kmax2, if Rmin1≤R<Rmax2, then determine a preset information length value K0 and a preset coding rate value R0 based on a block error performance of the target base graph and a delay performance affected by a lifting parameter of the target base graph, and compare the data information length with the preset information length value K0 and compare the channel coding rate with the preset coding rate value R0, select the first base graph as the target base graph if K0≤K<Kmax2 and R0≤R<Rmax2, select the second base graph as the target base graph if K<K0 or R<R0.

Optionally, the processor 500 is further configured to: in a case that the target base graph selection strategy is the third base graph selection strategy, if Rmin2≤R<Rmin1 and the first base graph supports encoding performed by using K less than Kmax1 and R less than Rmin1 in a case of K/R≤Nmax, then select the first base graph as the target base graph, wherein Nmax=Kmax1/Rmin1.

Optionally, the processor 500 is further configured to: select the first base graph as the target base graph if Rmin1≤R≤Rmax1, in a case that the target base graph selection strategy is the third base graph selection strategy.

Optionally, the processor 500 is further configured to: generate a check matrix for the to-be-encoded data based on the target base graph, a target information length, and a target coding rate.

Optionally, the target information length is acquired by adding the data information length with Kmin1−K zeros in a case that Kmin2≤K<Kmin1 and Rmax2<R≤Rmax1; otherwise, the target information length is equal to the data information length; wherein K denotes the data information length, Kmin1 denotes a first minimum information length of a first base graph in the base graphs, Kmin2 denotes a second minimum information length of a second base graph in the base graphs, R denotes the channel coding rate, Rmax1 denotes a first maximum coding rate of the first base graph, and Rmax2 denotes a second maximum coding rate of the second base graph.

Optionally, the target coding rate is equal to the channel coding rate.

It should be further noted that the mobile terminal described in this specification includes, but is not limited to, a smartphone, a tablet, and the like, and many of described functional components are referred to as modules in order to more particularly emphasize independence of their implementations.

In the embodiments of that present disclosure, the modules may be implemented by software to be executed by various types of processors. For example, an identified executable code module may include one or more physical or logical blocks including computer instructions, which may be constructed as an object, process, or function, for example. However, an executable code of the identified module does not need to be physically located together, but may include different instructions stored in different locations that, in a case that the different instructions are logically combined, the instructions constitute the modules and achieve the specified purpose of the module.

In practice, a module including an executable code may be a single instruction or a plurality of instructions, and may even be distributed over a plurality of different code segments, among different programs, and across multiple storage devices. Likewise, operational data may be identified within a module and may be implemented in any suitable form and organized within any suitable type of data structure. The operational data may be collected as a single data set, or may be distributed across different locations (including at different storage devices), and at least in part may only exist as an electronic signal on a system or a network.

In a case that the module may be realized by the software, considering a level of a related hardware process, the module may be realized by software, and a corresponding hardware circuit may be designed by a person skilled in the art to realize the corresponding function, without considering a cost. The hardware circuit includes a conventional Very Large Scale Integrated (VLSI) circuit or a gate array and a related semiconductor such as a logic chip, a transistor, or other discrete elements. The module may also be implemented by a programmable hardware device, such as a Field Programmable Gate Array, a programmable array logic, a programmable logic device, and the like.

Exemplary embodiments described above are described with reference to the drawings, and many different forms and embodiments are possible without departing from the spirit and teachings of the present disclosure, and thus, the present disclosure should not be constructed as being limited to the exemplary embodiments set forth herein. In particular, these exemplary embodiments are provided such that the present disclosure will be complete and comprehensive and will convey the scope of the present disclosure to those skilled in the art. In these drawing, a dimension and a relative dimension of the components may be exaggerated for purpose of clarity. Terms used herein are for purposes of describing particular exemplary embodiments only and are not intended to be limiting. As used herein, a singular expression "a," "a," and "the" is intended to encompass "a plurality of" unless a context herein clearly indicates otherwise. It will be further appreciated that terms such as "include" and/or "including", in case of being used in this specification, denote presence of features, integers, steps, operations, components and/or members, without excluding presence or addition of one or more other features, integers, steps operations, components members and/or groups. Unless otherwise indicated and stated, a range of values includes upper and lower limits of the range and any sub-ranges between the upper and lower limits.

The foregoing are optional embodiments of the present disclosure. It should be noted that several modifications and refinements may be made by those of ordinary skills in the art without departing from principles of the present disclosure, These modifications and refinements should also be considered to be within the scope of the present disclosure.

What is claimed is:

1. A method for selecting a base graph of a low-density parity-check code, comprising:
acquiring a data information length and a channel coding rate of to-be-encoded data;
determining a target base graph selection strategy according to the data information length and an information length range of a base graph; and
determining a target base graph for the to-be-encoded data according to the target base graph selection strategy and the channel coding rate, wherein determining the target base graph selection strategy according to the data information length and the information length range of the base graph, comprises:
acquiring a first minimum information length Kmin1 and a first maximum information length Kmax1 of a first graph in the base graph;
acquiring a second minimum information length Kmin2 and a second maximum information length Kmax2 of a second graph in the base graph; and
determining the target base graph selection strategy based on a size relation among the data information length K and the first minimum information length, the first maximum information length, the second maximum information length, and the second maximum information length,
wherein Kmin2<Kmin1≤Kmax2<Kmax1.

2. The method according to claim 1, wherein determining the target base graph selection strategy based on the size relation among the data information length K and the first minimum information length, the first maximum information length, the second minimum information length, and the second maximum information length, comprises:
determining the target base graph selection strategy to be a first base graph selection strategy in a case that Kmin2≤K<Kmin1;
determining the target base graph selection strategy to be a second base graph selection strategy in a case that Kmin1≤K<Kmax2; and
determining the target base graph selection strategy to be a third base graph selection strategy in a case that Kmax2<K≤Kmax1.

3. The method according to claim 2, wherein determining the target base graph for the to-be-encoded data according to the target base graph selection strategy and the channel coding rate, comprises:
acquiring a first minimum coding rate Rmin1 and a first maximum coding rate Rmax1 of the first graph in the base graph;

acquiring a second minimum coding rate Rmin2 and a second maximum coding rate Rmax2 of the second graph in the base graph;

comparing the channel coding rate R with the first minimum coding rate, the first maximum coding rate, the second minimum coding rate and the second maximum coding rate, and acquiring a result of the comparison; and determining the target base graph based on the target base graph selection strategy and the result of the comparison, wherein, Rmin2<Rmin1<Rmax2<Rmax1.

4. The method according to claim 3, wherein, determining the target base graph based on the target base graph selection strategy and the result of the comparison, comprises:

selecting the second graph as the target base graph if Rmin2≤R≤Rmax2, in a case that the target base graph selection strategy is a first base graph selection strategy; or, selecting the first graph as the target base graph if Rmax2<R≤Rmax1, in a case that the target base graph selection strategy is a first base graph selection strategy; or, selecting the second graph as the target base graph if Rmin2≤R≤Rmax2, in a case that the target base graph selection strategy is a second base graph selection strategy and Kmin1=Kmax2; or, selecting the first graph as the target base graph if Rmax2≤R<Rmax1, in a case that the target base graph selection strategy is a second base graph selection strategy and Kmin1=Kmax2; or, selecting the second graph as the target base graph if Rmin2≤R<Rmin1, in a case that the target base graph selection strategy is a second base graph selection strategy and Kmin1<Kmax2; or, selecting the first graph as the target base graph if Rmax2≤R≤Rmax1, in a case that the target base graph selection strategy is a second base graph selection strategy and Kmin1<Kmax2; or, in a case that the target base graph selection strategy is a second base graph selection strategy and Kmin1<Kmax2, if Rmin1≤R<Rmax2, then determining a preset information length value K0 and a preset coding rate value R0 based on a block error performance of the target base graph and a delay performance affected by a lifting parameter of the target base graph, and comparing the data information length with the preset information length value K0 and comparing the channel coding rate with the preset coding rate value R0, selecting the first graph as the target base graph if K0≤K<Kmax2 and R0≤R<Rmax2, selecting the second graph as the target base graph if K<K0 or R<R0; or, in a case that the target base graph selection strategy is a third base graph selection strategy, if Rmin2≤R<Rmin1 and the first graph supports encoding performed by using K less than Kmax1 and R less than Rmin1 in a case of K/R≤Nmax, then selecting the first graph as the target base graph, wherein Nmax=Kmax1/Rmin1; or, selecting the first graph as the target base graph if Rmin1≤R≤Rmax1, in a case that the target base graph selection strategy is a third base graph selection strategy.

5. The method according to claim 1, wherein after determining the target base graph for the to-be-encoded data, the method further comprises:

generating a check matrix for the to-be-encoded data based on the target base graph, a target information length, and a target coding rate.

6. The method according to claim 5, wherein the target information length is acquired by adding the data information length with Kmin1-K zeros in a case that Kmin2≤K<Kmin1 and Rmax2<R≤Rmax1; otherwise, the target information length is equal to the data information length; wherein K denotes the data information length, Kmin1 denotes a first minimum information length of a first graph in the base graph, Kmin2 denotes a second minimum information length of a second graph in the base graph, R denotes the channel coding rate, Rmax1 denotes a first maximum coding rate of the first graph, and Rmax2 denotes a second maximum coding rate of the second graph.

7. The method according to claim 5, wherein the target coding rate is equal to the channel coding rate.

8. A device for selecting a base graph of a low-density parity-check code, comprising: a processor, a storage, and a bus interface, wherein the bus interface is configured to connect the processor with the storage, the storage is configured to store a program and data, the processor is configured to read the program and the data stored in the storage to:

acquire a data information length and a channel coding rate of to-be-encoded data;

determine a target base graph selection strategy according to the data information length and an information length range of a base graph; and determine a target base graph for the to-be-encoded data according to the target base graph selection strategy and the channel coding rate;

wherein the processor is configured to read the program and the data stored in the storage to:

acquire a first minimum information length Kmin1 and first maximum information length Kmax1 of a first graph in the base graph;

acquire a second minimum information length Kmin2 and a second maximum information length Kmax2 of a second graph in the base graph; and determine the target base graph selection strategy based on a size relation among the data information length K and the first minimum information length, the first maximum information length, the second minimum information length, and the second maximum information length, wherein Kmin2<Kmin1≤Kmax2<Kmax1.

9. The device according to claim 8, wherein the processor is configured to read the program and the data stored in the storage to:

determine the target base graph selection strategy to be a first base graph selection strategy in a case that Kmin2≤K<Kmin1;

determine the target base graph selection strategy to be a second base graph selection strategy in a case that Kmin1≤K≤Kmax2; and determine the target base graph selection strategy to be a third base graph selection strategy in a case that Kmax2<K≤Kmax1.

10. The device according to claim 9, wherein the processor is configured to read the program and the data stored in the storage to:

acquire a first minimum coding rate Rmin1 and a first maximum coding rate Rmax1 of the first graph in the base graph;

acquire a second minimum coding rate Rmin2 and a second maximum coding rate Rmax2 of the second graph in the base graph;

compare the channel coding rate R with the first minimum coding rate, the first maximum coding rate, the second minimum coding rate and the second maximum coding rate, and acquire a result of the comparison; and determine the target base graph based on the target base graph selection strategy and the result of the comparison, wherein, Rmin2<Rmin1<Rmax2<Rmax1.

11. The device according to claim 10, wherein the processor is configured to read the program and the data stored in the storage to:

select the second graph as the target base graph if Rmin2≤R≤Rmax2, in a case that the target base graph selection strategy is a first base graph selection strategy; or, select the first graph as the target base graph if Rmax2<R≤Rmax1, in a case that the target base graph selection strategy is a first base graph selection strategy; or, select the second graph as the target base graph if Rmin2≤R≤Rmax2 in a case that the target base graph selection strategy is a second base graph selection strategy and Kmin1=Kmax2, or, configured to select the first graph as the target base graph if Rmax2<R≤Rmax1 in a case that the target base graph selection strategy is a second base graph selection strategy and Kmin1=Kmax2; or, select the second graph as the target base graph if Rmin2≤R<Rmin1, in a case that the target base graph selection strategy is a second base graph selection strategy and Kmin1<Kmax2; or, select the first graph as the target base graph if Rmax2≤R≤Rmax1, in a case that the target base graph selection strategy is a second base graph selection strategy and Kmin1<Kmax2; or, in a case that the target base graph selection strategy is a second base graph selection strategy and Kmin1<Kmax2, if Rmin1≤R<Rmax2, then determine a preset information length value K0 and a preset coding rate value R0 based on a block error performance of the target base graph and a delay performance affected by a lifting parameter of the target base graph, and compare the data information length with the preset information length value K0 and compare the channel coding rate with the preset coding rate value R0, select the first graph as the target base graph if K0≤K<Kmax2 and R0≤R<Rmax2, select the second graph as the target base graph if K<K0 or R<R0; or, in a case that the target base graph selection strategy is a third base graph selection strategy, if Rmin2≤R<Rmin1 and the first graph supports encoding performed by using K less than Kmax1 and R less than Rmin1 in a case of K/R≤Nmax, then select the first graph as the target base graph, wherein Nmax=Kmax1/Rmin1; or, select the first graph as the target base graph if Rmin1≤R≤Rmax1, in a case that the target base graph selection strategy is a third base graph selection strategy.

12. The device according to claim 8, wherein the processor is configured to read the program and the data stored in the storage to:

generate a check matrix for the to-be-encoded data based on the target base graph, a target information length, and a target coding rate.

13. The device according to claim 12, wherein the target information length is acquired by adding the data information length with Kmin1-K zeros in a case that Kmin2≤K<Kmin1 and Rmax2<R≤Rmax1; otherwise, the target information length is equal to the data information length; wherein K denotes the data information length, Kmin1 denotes a first minimum information length of a first graph in the base graph, Kmin2 denotes a second minimum information length of a second graph in the base graph, R denotes the channel coding rate, Rmax1 denotes a first maximum coding rate of the first graph, and Rmax2 denotes a second maximum coding rate of the second graph.

14. The device according to claim 12, wherein the target coding rate is equal to the channel coding rate.

15. A non-volatile computer readable storage medium, comprising:

a program and an instruction stored on the non-volatile computer-readable storage medium, wherein a processor of a computer executes the program and the instruction to:

acquire a data information length and a channel coding rate of to-be-encoded data;

determine a target base graph selection strategy according to the data information length and an information length range of a base graph; and determine a target base graph for the to-be-encoded data according to the target base graph selection strategy and the channel coding rate;

wherein the processor of the computer executes the program and the instruction to:

acquire a first minimum information length Kmin1 and a first maximum information length Kmax1 of a first graph in the base graph;

acquire a second minimum information length Kmin2 and a second maximum information length Kmax2 of a second graph in the base graph; and determine the target base graph selection strategy based on a size relation among the data information length K and the first minimum information length, the first maximum information length, the second minimum information length, and the second maximum information length, wherein Kmin2<Kmin1≤Kmax2<Kmax1.

* * * * *